United States Patent

Horiuchi

[11] Patent Number: 5,886,583
[45] Date of Patent: Mar. 23, 1999

[54] OSCILLATOR CONTROL CIRCUIT INCLUDING A PHASE DIFFERENCE CHANGE-DETECTING CIRCUIT

[75] Inventor: Yoshifumi Horiuchi, Tokyo, Japan

[73] Assignee: NEC Corporation, Tokyo, Japan

[21] Appl. No.: 622,029

[22] Filed: Mar. 26, 1996

[51] Int. Cl.⁶ .................................................. H03L 7/085
[52] U.S. Cl. ................................ 331/11; 331/17; 331/25
[58] Field of Search .................................... 331/11, 17, 25

[56] References Cited

U.S. PATENT DOCUMENTS 4,847,569  7/1989  Dudziak et al. ............................ 331/25
4,864,253  9/1989  Zwack ....................................... 331/25

FOREIGN PATENT DOCUMENTS

3-235078  10/1991  Japan .
4-278723  10/1992  Japan .

Primary Examiner—Siegfried H. Grimm

[57] ABSTRACT

An oscillator with higher frequency stability. The phase arator circuit 17 detects a phase difference between a second-interval reference pulse signal 16 outputted from a GPS receiver 15 and an almost second-interval pulse signal 14 obtained by dividing output of a voltage-controlled oscillator 11 with a counter circuit 13. The delay circuit 31 and the difference calculating circuit 32 determine changes in the phase difference every second, while the averaging circuit 35 determines the mean value of the changes. The control voltage is changed to decrease the mean value of the changes to first match the frequency of the pulse signal 14 with that of the reference pulse signal 16, and the voltage of the control signal at this moment is stored. The voltage of the control signal is then changed to match the phases. The voltage of the control signal is restored to the stored value when the phases match. Since the oscillation frequency is controlled based on the mean value of the changes in the phase difference, the long-term frequency stability of GPS signals is incorporated in the stability of the oscillation frequency of the voltage-controlled oscillator.

5 Claims, 5 Drawing Sheets

| ELAPSED TIME | SAMPLE COUNT |
|---|---|
| 0-1 min. | 5 |
| 1-10 min. | 20 |
| 10 min. thr. 1 hr. | 50 |
| 1-2 hrs. | 60 |
| 2-8 hrs. | 70 |
| 8-24 hrs. | 80 |
| Over 24 hrs. | 100 |

OSCILLATOR CONTROL CIRCUIT INCLUDING A PHASE DIFFERENCE CHANGE-DETECTING CIRCUIT

DETAILED DESCRIPTION OF THE INVENTION

1. Field of the Invention

The present invention relates to an oscillator capable of compensating for changes in oscillation frequency, and more particularly to an oscillator for which extremely high level of frequency stability is needed.

2. Description of the Prior Art

Excellent frequency stability is needed for reference clock signals which are used for picture signals sent from broadcasting stations. The reference clock signals used by respective broadcasting stations are needed to be in phase for synchronization with picture signals sent by other stations. Oscillators, which generate such reference clock signals usually include crystal oscillators for standard oscillation frequencies. Although the oscillation frequencies of crystal oscillators are very stable in the short term, they change in the long term as well under the influence of ambient temperature. Therefore, it is conventional to measure temperatures surrounding crystal oscillators, and to correct the oscillation frequencies based on the results.

For example, in cases where a signal of a given frequency is oscillated by applying a given control voltage across a voltage-controlled oscillator (VCO), the value of the control voltage is varied depending on the ambient temperature measured with a temperature sensor. With such an oscillator, one-to-one correspondence between values of the control voltage for producing given frequencies and ambient temperatures in 0.5° steps, for example, is established and stored in a PROM (programmable read only memory). A control voltage matching the temperature measurement is read out by converting the output voltage of the temperature sensor into a digital signal through an A/D converter and inputting the signal as an address signal to the PROM. The reading is converted into an analog voltage signal through a D/A converter, and inputted to the voltage-controlled oscillator as a control signal for the oscillation frequency. The influence of the temperature is thus cancelled for oscillation at a constant frequency.

Meanwhile, positioning radio waves sent from navigation satellites are recently utilized to determine positions of the receiving points or directions of movement of the receiving points. Representative of such positioning systems are GPS (Global Positioning System). GPS radio waves from navigation satellites contain second-interval pulse signals in synchronization with coordinated universal time (UTC), as well as information for positioning.

In order to determine the positions of the receiving points and the directions of movement of the receiving points based on GPS radio waves, it is necessary to compare the phases of the received radio wave and a reference signal of a given frequency. Japanese Unexamined Patent Application Disclosure HEI 4(1992)-278723 discloses a GPS receiving apparatus designed for stabilizing the oscillation frequency of the reference signal used for phase comparison. This receiving apparatus is designed to cancel the influence of temperature by converting the frequency of the reference signal outputted from the oscillator based on measurements of the ambient temperature by a frequency synthesizer, instead of controlling the oscillation frequency itself of the reference signal generated by the oscillator depending on the ambient temperature.

In addition, Japanese Unexamined Patent Application Disclosure HEI 3(1991)-235078 discloses a GPS receiving apparatus which uses a PLL (Phased Locked Loop) circuit to scrutinize positioning GPS radio waves sent from navigation satellites. The apparatus is designed in such a manner that the operation of the PLL circuit is suspended until the demodulation strength of the GPD radio wave-receiving demodulator reaches a given level, while successively changing the frequency of the regenerative carrier wave used in the demodulator at frequency intervals wider than the capture range of the PLL circuit. This is designed to shorten the time necessary to begin scrutinizing positioning GPS radio waves.

The temperature characteristic of the oscillation frequency of a crystal oscillator is usually represented by a three-dimensional curve. Accordingly, it is difficult to precisely compensate for the influence of change in ambient temperature by changing the control voltage applied to the voltage-controlled oscillator based on the measured ambient temperature, and thus a problem of the prior art has been its inability to properly compensate for temperature. In addition, compensation of the temperature characteristic represented by a three-dimensional curve with higher accuracy has problem of a more complicated temperature compensation circuit.

On the other hand, the use of second-interval pulse signals contained in positioning GPS radio waves to adjust oscillation frequencies of oscillators results in a simple circuit configuration as compared with cases where compensation is made with reference to the complex three-dimensional curve. The frequency stability of the second-interval pulses contained in GPS radio waves, however, though high in the long term, is not very high in the short term. For this reason, the use of a GPS radio wave as the reference to control oscillation frequencies of an oscillator with a PLL circuit, for example, has the problem of lower short-term frequency stability.

SUMMARY OF THE INVENTION

Therefore, it is an object of the present invention to provide an oscillator with improved frequency stability both in the long term and in the short term.

According to the invention as claimed in claim 1, the oscillating apparatus is equipped with a voltage control oscillator for outputting an electric signal of a frequency based on the.voltage of an inputted control signal; phase difference change-detecting means for detecting change in the phase difference between the electric signal outputted by the voltage control oscillator and a reference signal of a given frequency; first control-voltage varying means for varying the voltage of the control signal to decrease the change in the phase difference detected by the phase difference change-detecting means; first comparison means for making a comparison between the admissible change in the phase difference predetermined based on the admissible difference between the frequency of the reference signal and the frequency of the electric signal outputted by the voltage control oscillator, and the change in the phase difference detected by the phase difference change-detecting means; control-voltage storage means for storing the voltage of the control signal at the instant when the change in the phase difference has decreased to or below the admissible value; phase difference-detecting means for detecting a phase difference between the electric signal outputted by the voltage control oscillator and the reference signal; second control-voltage varying means for varying the voltage of the control signal to decrease the phase difference detected by the phase difference-detecting means from the instant when the change in the phase difference has decreased to or below the admissible value; second comparison means for making a comparison between the phase difference detected by the phase difference-detecting means, and the predetermined admissible phase difference between the reference signal and the electric signal outputted by the voltage control oscillator; and control-voltage supplying means for supplying a control signal at the voltage stored in the control-voltage storage means to the voltage control oscillator from the instant when the detected phase difference has decreased to or below the admissible phase difference.

In other words, according to the invention as claimed in claim 1, the voltage of the control signal applied to the voltage-controlled oscillator is controlled so as to decrease the change in phase difference, and the voltage of the control signal which caused the change in phase difference to decrease below the admissible value is stored. The voltage of the control signal is then controlled so that the change in phase difference decreases, and a control signal at the same voltage as the stored one is supplied to the voltage-controlled oscillator when the change in phase difference decreases below the admissible value. When the change in phase difference has decreased across the admissible value, the frequency of the output signal of the voltage-controlled oscillator is almost the same as that of the reference signal. Therefore, matching of the frequencies is first established based on the change in phase difference, and the value of the control voltage at that time is stored. Thereafter, the control voltage is changed to match the phases, and the value of the control voltage is restored to the stored voltage at the time when the phases match. In this way, the output signal of the voltage-controlled oscillator is matched with the reference signal in both frequency and phase.

According to the invention as claimed in claim 2, the oscillating apparatus is equipped with a voltage control oscillator for outputting an electric signal of a frequency based on the voltage of an inputted control phase difference change-detecting means for cyclically detecting change in the phase difference between the electric signal outputted by the voltage control oscillator and a given reference signal with more excellent long-term frequency stability than short-term frequency stability; phase difference change-averaging means for determining a mean value of changes in the phase difference over a predetermined cycle count of the reference signal; first control-voltage varying means for varying the voltage of the control signal to decrease the mean value of changes in the phase difference determined by the phase difference change-averaging means; first comparison means for making a comparison between the admissible change in the phase difference predetermined based on the admissible difference between the frequency of the reference signal and the frequency of the electric signal outputted by the voltage control oscillator, and the mean value determined by the phase difference change-averaging means; control-voltage storage means for storing the voltage of the control signal at the instant when the mean value of changes in the phase difference has decreased to or below the admissible value; phase difference-detecting means for detecting a phase difference between the electric signal outputted by the voltage control oscillator and the reference signal; second control-voltage varying means for varying the voltage of the control signal to decrease the phase difference detected by the phase difference-detecting means from the instant when the mean value of changes in the phase difference has decreased to or below the admissible value; second comparison means for making a comparison between the phase difference detected by the phase difference-detecting means, and the predetermined admissible phase difference between the reference signal and the electric signal outputted by the voltage control oscillator; and control-voltage supplying means for supplying a control signal at the voltage stored in the control-voltage storage means to the voltage control oscillator from the instant when the detected phase difference has decreased to or below the admissible phase difference.

In other words, according to the invention as claimed in claim 2, the oscillation frequency of the voltage-controlled oscillator is controlled based on the mean value of the changes in phase difference over the predetermined cycle count. This allows the long-term frequency stability of the reference signal to be incorporated in the stability of the oscillation frequency.

According to the invention as claimed in claim 3, the oscillating apparatus is equipped with a voltage control oscillator fog outputting an electric signal of a frequency based on the voltage of an inputted control signal; counting means for outputting a given pulse signal each time the cycle of the electric signal outputted by the voltage control oscillator is counted a number of times equal to the quotient obtained by dividing the frequency of the electric signal outputted by the voltage control oscillator, by the frequency of a given reference signal with more excellent long-term frequency stability than short-term frequency stability; phase difference change-detecting means for detecting changes in the phase difference between the pulse signal outputted by the counting means and the given reference signal per cycle of the reference signal; phase difference change-averaging means f6r determining a mean value of changes in the phase difference over a predetermined cycle count of the reference signal; first control-voltage varying means for varying the voltage of the control signal to decrease the mean value of changes in the phase difference determined by the phase difference change-averaging means; first comparison means for making a comparison between the admissible change in the phase difference predetermined based on the admissible difference between the frequency of the reference signal and the frequency of the pulse signal, and the mean value determined by the phase difference change-averaging means; control-voltage storage means for storing the voltage of the control signal at the instant when the mean value of changes in the phase difference has decreased to or below the admissible value; phase difference-detecting means for detecting a phase difference between the pulse signal outputted by the counting means and the reference signal; second control-voltage varying means for varying the voltage of the control signal to decrease the phase difference detected by the phase difference-detecting means from the instant when the mean value of changes in the phase difference has decreased to or below the admissible value; second comparison means for making a comparison between the phase difference detected by the phase difference-detecting means, and the predetermined admissible phase difference between the reference signal and the pulse signal; and control-voltage supplying means for supplying a control signal at the voltage stored in the control-voltage storage means to the voltage control oscillator from the instant when the detected phase difference has decreased to or below the admissible phase difference.

In other words, according to the invention as claimed in claim 3, the counting means is used to output a pulse signal with the frequency of an electric signal outputted by the voltage-controlled oscillator which has been changed to match the frequency of the reference signal. This allows control of the oscillation frequency and the phase of the voltage-controlled oscillator with reference to the reference signal even in cases where the oscillation frequency of the voltage-controlled oscillator is different from that of the reference signal.

According to the invention as claimed in claim 4, the predetermined cycle count for averaging is set so that the frequency stability of the reference signal over the cycle count is higher than the frequency stability of the voltage control oscillator.

In other words, according to the invention as claimed in claim 4, the cycle count for averaging is set so that the frequency stability of the reference signal over the predetermined cycle count is higher than the frequency stability of the voltage control oscillator. This results in higher long-term frequency stability of the voltage-controlled oscillator by changing the control voltage based on the mean value of changes in phase difference.

According to the invention as claimed in claim 5, the phase difference change-averaging means is equipped with timing means for measuring the elapsed time from power-on, and averaging cycle count-storage means for storing a plurality of cycle counts for averaging which correspond to the elapsed times from power-on, and the cycle count for averaging is varied based on the elapsed times from power-on.

In other words, according to the invention as claimed in claim 5, the cycle count for averaging is varied based on the elapsed times from power-on. The frequency stability of the voltage-controlled oscillator is low immediately after power-on, and is gradually improved with time. Accordingly, the oscillation frequency may efficiently be compensated by changing the cycle count for averaging, depending on the elapsed times from power-on.

DETAILED DESCRIPTION OF THE PREFERRED EMBODIMENTS

The present invention will now be explained in detail with reference to embodiments thereof.

Figure 1:
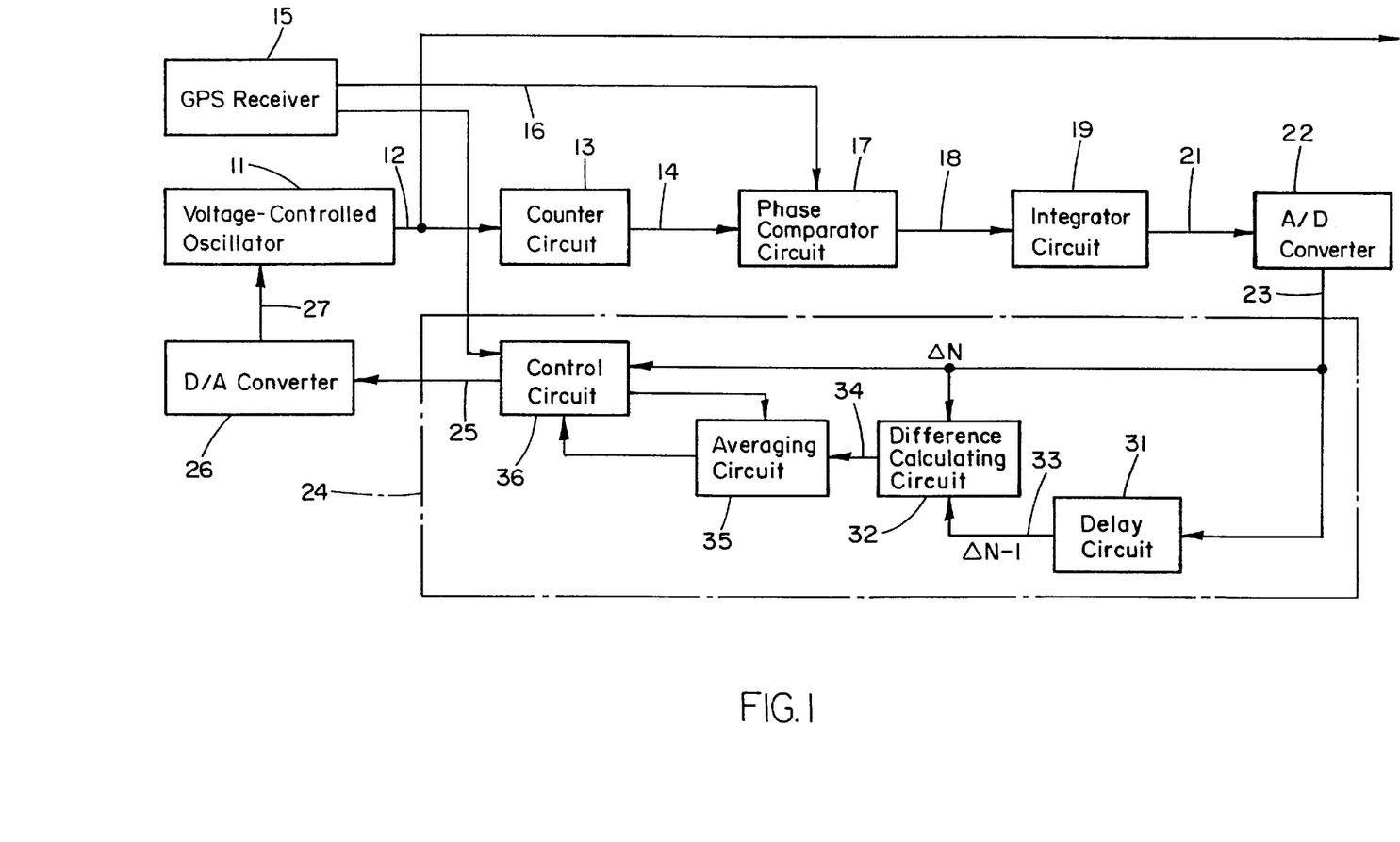
FIG. 1 is a schematic block diagram illustrative of the configuration of an oscillating apparatus according to an embodiment of the prevent invention.

FIG. 1 is a schematic view illustrative of the configuration of an oscillating apparatus according to an embodiment of the present invention. This oscillating apparatus is designed to stabilize an oscillation frequency through the use of second-interval pulse signals contained in GPS radio waves. The signal outputted from a voltage-controlled oscillator 11 is inputted to a counter circuit 13 as a clock signal 12. The clock signal outputted from the voltage-controlled oscillator 11 is designed to be outputted as an output signal from the oscillator 11. The counter circuit 13 is designed to output a pulse signal 14 each time the clock signal 12 is counted a predetermined number of times. Representing the frequency expected to be oscillated by the oscillator by "f", the counter circuit 13 is designed to output a pulse signal 14 each time the clock signal 12 is counted "f" times. Accordingly, in cases where the oscillation frequency of the voltage-controlled oscillator 11 is exactly "f", the counter circuit 13 is designed to output the pulse signal 14 every second.

The GPS receiver 15 is designed to receive GPS radio waves from a navigation satellite, and outputs a reference pulse signal 16 with a cycle of one second. The reference pulse signal acnd the pulse signal are inputted to a phase comparator circuit 17. The phase comparator circuit 17 is designed to compare phases of these signals and to output a phase difference signal 18 with a pulse width based on the phase difference. The integrator circuit 19 is designed to integrate the phase difference signal 18 and to output a voltage signal 21 at a voltage based on the pulse width. The voltage signal 21 is inputted to an A/D converter 22, and the signal changed into a digital signal 23 is inputted to a CPU (central processing unit) 24 via a given input board (not shown). The CPU 24 is designed to output a frequency control signal 25 for controlling the oscillation frequency of the voltage-controlled oscillator 11 based on the digital signal 23. More specifically, the oscillation frequency of the voltage-controlled oscillator 11 is designed to be controlled through the use of the long-term frequency stability of the reference pulse signal 16 derived from the GPS radio waves.

The CPU 24 contains an internal ROM (read only memory) for storing programs or fixed data and RAM (random access memory) for temporarily storing data necessary to execute the programs. A frequency control signal 25 outputted from the CPU 24 is inputted to a D/A converter 26, and an analog voltage signal 27 resulting from conversion is inputted to the voltage-controlled oscillator 11.

In FIG. 1, circuit sections in the area surrounded by an alternate lone and short dash line are a functional representation of processing to be executed by the CPU 24. The delay circuit 31 is designed to output the inputted digital signal 23 delayed by one pulse of the reference pulse 16. The output from the delay circuit 31 and the digital signal 23 are inputted to a difference calculating circuit 32. This difference calculating circuit 32 is the section for calculating the difference between the value of the digital signal 23 and the value of the delayed digital signal 33 outputted from the delay circuit 31. In other words, the difference calculating circuit 32 is designed to output a phase difference change signal 34 of the value corresponding the change in the phase difference between the reference pulse signal 16 and the pulse signal 14. The change is the difference in frequency between the reference pulse signal 16 and the pulse signal 14, and the change "0" in the phase difference indicates that the frequencies of those signals match.

The output 34 from the difference calculating circuit 32 is inputted to an averaging circuit 35. This averaging circuit 35 is the section for determining a mean value of a predetermined number of samples of the phase difference change signal 34. This averaging is designed to accommodate short-term changes in second-interval pulses contained in GPS radio waves. The output from the averaging circuit 35 is inputted to a control circuit 36. The digital signal 23 is inputted to the control circuit 36. The control circuit 36 is designed to output a frequency control signal 25 for controlling the oscillation frequency of the voltage-controlled oscillator 11 based on these signals.

Figure 2:
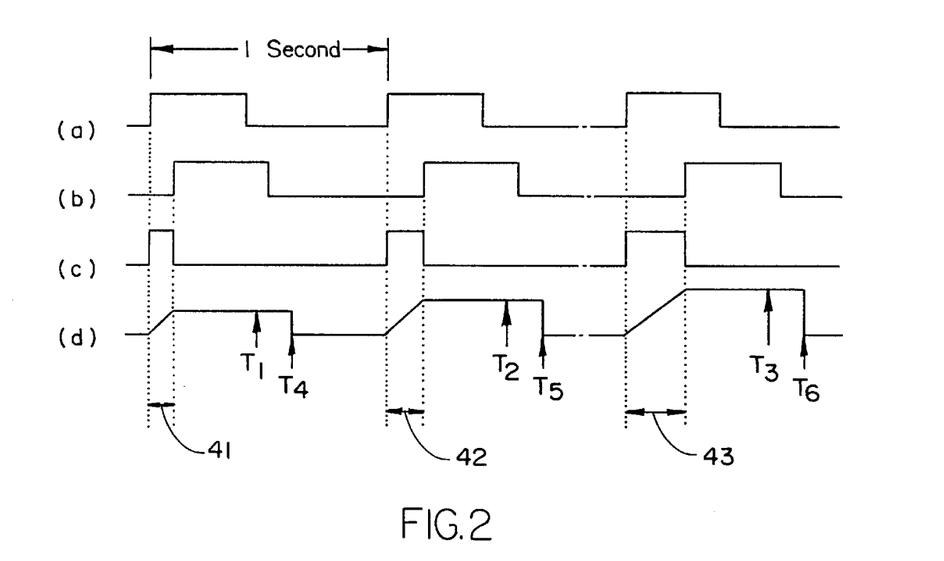
FIG. 2 is a view illustrative of a variety of waveforms which represent signal waveforms at various sections of the oscillating apparatus shown in FIG. 1.

FIG. 2 illustrates signal waveforms observed in various sections of the oscillating apparatus shown in FIG. 1. The GPS receiver 15 receiving GPS radio waves from a navigation satellite outputs an almost second-interval reference pulse signal 16 (FIG. 2a). The duty ratio of the reference pulse signal 16 is almost 25%. The pulse signal outputted from the counter circuit 13 is out of phase with the reference pulse signal 16. In addition, the frequency somewhat differs from 1 hertz. As a result, the phase differences 41, 42 and 43 of the pulse signal 14 during each cycle from the reference pulse signal 16 gradually change. The phase difference comparator circuit 17 outputs a phase difference signal 18 (FIG. 2c) of pulse widths corresponding to these phase differences of the signal. As shown in this drawing, the phase difference gradually increases, and the pulse width of the phase difference signal 18 gradually increases depending on the phase difference.

Since the integrator circuit 19 integrates the phase difference signal 18 for each cycle, the voltage of the voltage signal 21 (FIG. 2d) at the end of each integration gradually increases. The A/D converter 22 is designed to sample the voltage of the voltage signal 21 at times $T_1$, $T_2$ and $T_3$ approximately 0.5 seconds after each rising of the reference pulse signal 16 for conversion into the digital signal 23 based on the voltage. The output voltage of the integrator circuit 19 is designed to be initialized to "0" by a reset circuit (not shown) at times $T_4$, $T_5$ and $T_6$ immediately after each sampling. In this way, the value of the digital signal 23 outputted from the A/D converter 22 is designed to correspond to the phase difference between the pulse signal 14 and the reference pulse signal 16 for each cycle.

The CPU is designed to measure the elapsed time from power-on of the oscillating apparatus by an internal timer section (not shown). In addition, the CPU is designed to store a table of cycle counts for averaging in an internal ROM in advance which describes correspondence between sample counts for averaging the phase difference change signal 34 and the elapsed times from power-on. Since the frequency stability of the oscillator increases with time after power-on, the stability of the reference pulse signal 16 based on GPS radio waves immediately after power-on have a higher degree of precision even from the point of view of short-term stability than the frequency stability of the voltage-controlled oscillator 11. Therefore, a fewer number of samples are enough for averaging the phase difference change signal 34. In addition, the response to the control of the oscillation frequency becomes quicker as the number of the samples decreases. On the other hand, since the frequency stability of the voltage-controlled oscillator 11 increases with time after power-on, the number of samples for averaging must be increased to establish higher stability based on the reference pulse signal 16.

Therefore, the apparatus is designed to priorly store the table of sample counts for averaging which describes correspondence between the sample counts for averaging and the elapsed times after power-on, and the CPU 24 is designed to average changes in the phase differences of the stored number of samples based on the elapsed time. Data on the stability of the reference pulse signal 16 derived from GPS radio waves is on public view. In addition, data on the frequency stability of the voltage-controlled oscillator 11 after power-on is collected by prior measurement. Based on these, sample counts necessary to increase the frequency stability of the reference pulse signal 16 over the frequency stability of the pulse signal 15 are determined for the respective elapsed times from power-on and listed in the averaging sample count-listing table. As the sample count for averaging increases, the short-term instability of the frequency of the reference pulse signal derived from GPS radio waves is more easily alleviated.

Figure 3:
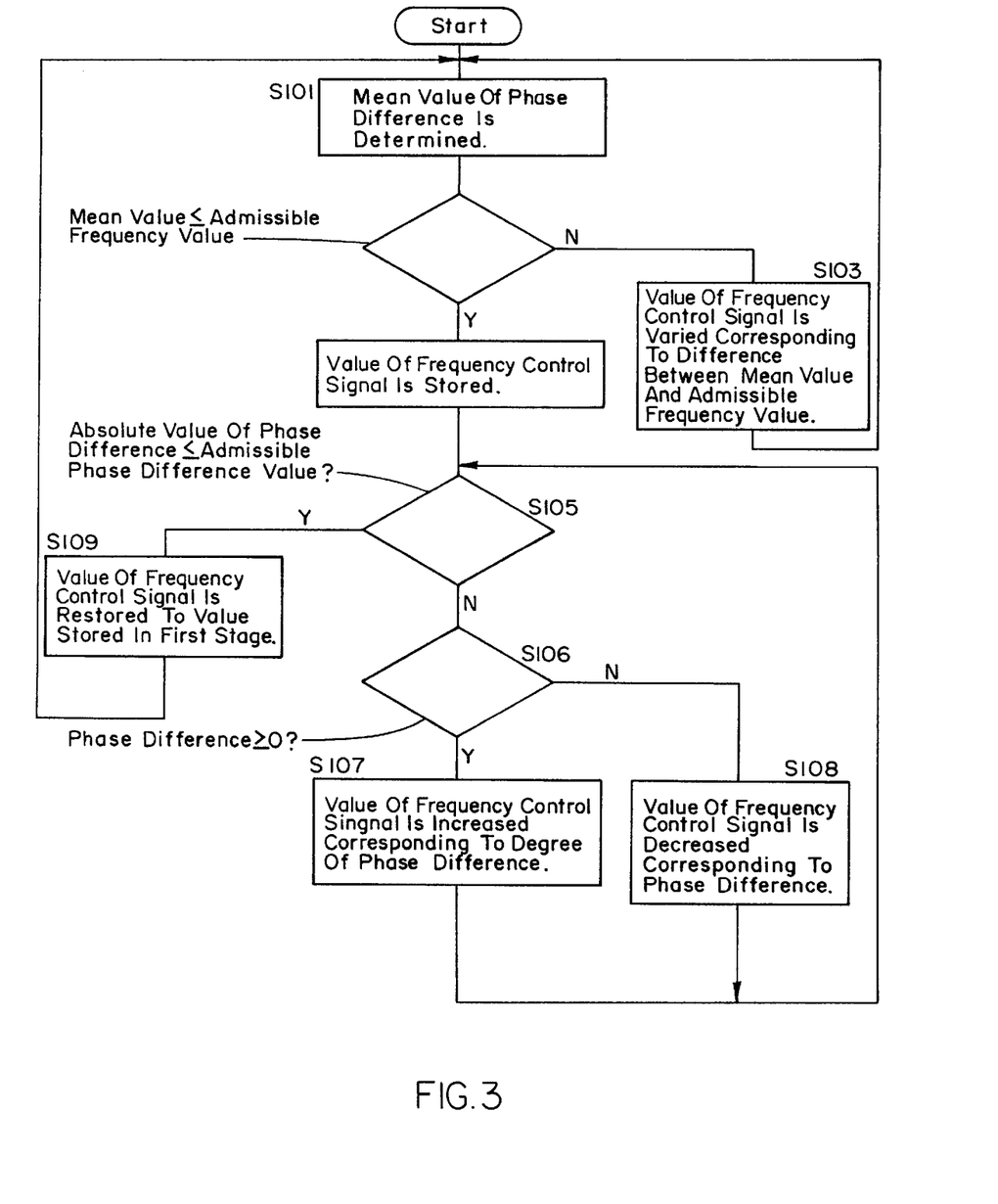
FIG. 3 is a flow chart for processing by a frequency compensation function-provided oscillating apparatus to match the oscillation frequency and the phase thereof with those of a reference signal.

FIG. 3 is a view illustrative of the flow of processing executed to match the oscillation frequency and the phase of the oscillating apparatus shown in FIG. 1 with those of the reference signal. Roughly speaking, the process comprises a first stage 51 for matching the frequency of the reference pulse signal 6 with the frequency of the pulse signal 14, and a second stage 52 for matching their phases after the frequencies have matched. In the first stage, the CPU 24 determines the mean value of changes in the phase difference, based on the phase difference signal 23 from the input port (step S101). The determined mean value is compared with a first prescribed value predetermined based on the admissible value of the frequency error (step S102).

The first prescribed value is determined based on the temperature characteristics of the integrator circuit 19, the A/D converter 22 and the D/A converter 26. This is because these circuit elements do not undergo compensation for temperature, and thus there is no need to lower the admissible value of the frequency below that expected based on the variable temperature-depending accuracies of these circuit elements. In cases where the mean value of the changes in the phase difference is more than the first prescribed value set based on the temperature characteristics of these circuit elements (for "N" in step S102), a value determined by the difference between the mean value and the first prescribed value is added to or subtracted from the value of the frequency control signal 25 (step S103).

After the value of the frequency control signal 25 has been varied, the process returns to step S101 to repeat the process until the mean value of the changes in the phase difference becomes smaller than the first prescribed value. Since the difference in frequency between the reference pulse signal 16 and the pulse signal 14 is reflected by the amount of change in the phase difference, a constant phase difference means match of the frequencies of the two signals. When the mean value of the changes in the phase difference decreases below the first prescribed value (for "Y" in step S102), the value of the frequency control signal 25 at that time is stored in a given area in the internal RAM in the CPU 24 (step S104). Here, the difference in frequency between the reference pulse signal 16 and the pulse signal 14 has been brought into the acceptable range by the foregoing procedures, and the process in the first stage is over.

The CPU 24 then proceeds to processing in the second stage f6r phase matching between the reference pulse signal 16 and the pulse signal 14. The CPU 24 determines whether the absolute value of the phase difference represented by the digital signal 23 inputted through the A/D converter 22 is smaller than the absolute value of the preset second prescribed value (step S105). The second prescribed value represents the admissible value of the phase difference, and this value is also set to a minimum within a detectable degree of precision after consideration of the temperature characteristics of the respective circuit elements likewise the first prescribed value. In cases where the absolute value of the phase difference is larger than the second prescribed value (for "N" in step S105), a determination is made as to whether the phase difference is positive or negative (step S106). If the phase difference is positive (for "Y" in step S106), the value of the frequency control signal 25 is increased depending on the difference between the phase difference and the second prescribed value (step S107). If the phase difference is negative (for "N" in step S106), the value of the frequency control signal 25 is decreased depending on the difference between the phase difference and the second prescribed value (step S108). These variations in the frequency control signal 25 based on whether the phase difference is positive or negative results in change in the oscillation frequency of the voltage-controlled oscillator 11 toward to less phase difference.

Figure 4:
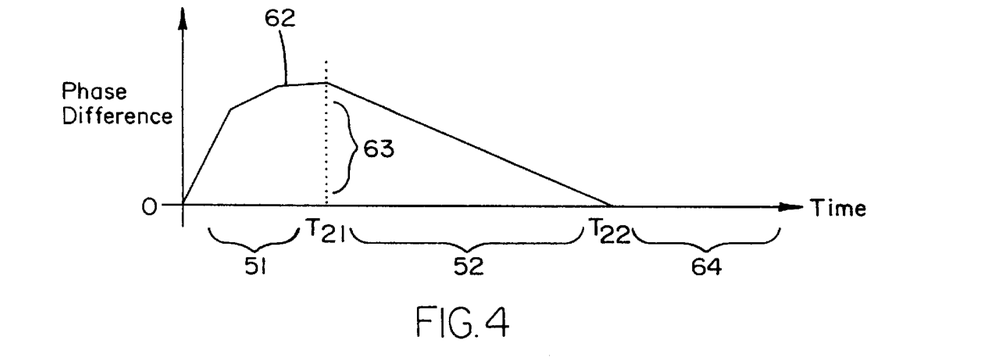
FIG. 4 is a view illustrative of change in phase difference until the frequency and the phase of a pulse signal match those of a reference pulse signal.

After the value of the frequency control signal 25 has been varied, the process returns to step S105 to compare the phase difference represented by the next inputted digital signal 23 with the second prescribed value. Step S105 through step S108 are repeated until the phase difference decreases below the second prescribed value. When the phase difference has decreased below the second prescribed value (for "Y" in step S105), the value of the frequency control signal 25 is restored to the value stored in step S104 (step S109). Since the value of the frequency control signal 25 is restored to the value when the frequencies are almost the same, at the time when the phases match, both the frequency difference and the phase difference may be decreased below the admissible values. Thereafter, the operation of the CPU 24 returns to step S101 to repeat the foregoing procedures successively. FIG. 4 is a view illustrative of the manner of changes in the phase difference until the frequency and the phase of a pulse signal match those of the reference pulse signal. Since the amount of change in the phase difference is controlled to "0" lin the first stage 51, the slope of the characteristic curve representing the phase difference becomes gradually gentle, and finally becomes a flat state 62. Here, the phase difference itself increases, whereas the amount of change in the phase difference decreases. At the time $T_{21}$ when the amount of change in the phase difference has reached "0", the first stage is over, and the pulse signal 14 and the reference pulse signal 16 have the same frequency. In the second stage, since the phase difference is controlled to decrease to "0", the phase difference gradually decreases. The phase difference then decreases below the admissible value at time $T_{22}$.

Figure 5:
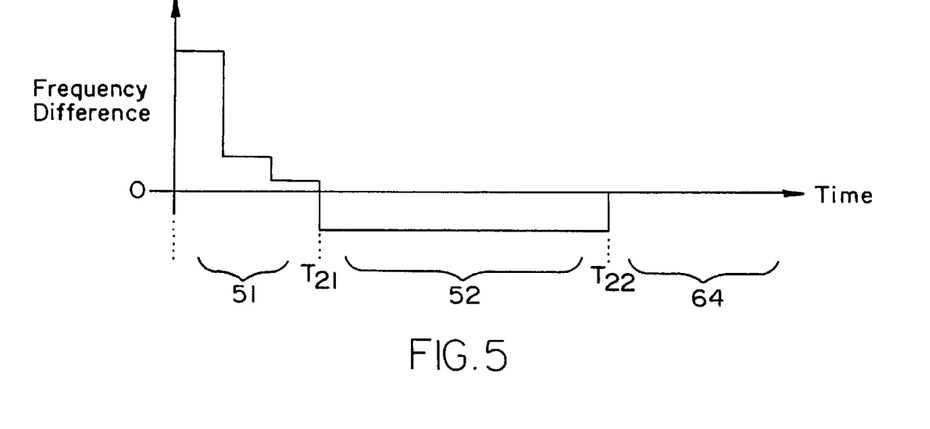
FIG. 5 is a view illustrative of change in frequency until the frequency and the phase of a pulse signal match with those of a reference pulse signal.

FIG. 5 is a view illustrative of the manner of changes in frequency until the frequency and the phase difference of the pulse signal match those of the reference pulse signal. In the first stage 51, the difference in frequency gradually decreases, and the frequencies are almost the same at time $T_{21}$. The phase difference 63 is controlled to decrease in the second stage 52. Here, the frequency matched in the first stage 51 is once varied to a different frequency. This variation results in a smaller phase difference at the rising of the next pulse. The frequencies are different until time $T_{22}$ when the phase difference becomes almost "0". At time $T_{22}$ when the phases match, the oscillation frequency of the voltage-controlled oscillator is restored to the frequency at time $T_{21}$, from then on both the frequency and the phase difference thereof match those of the reference pulse signal 16. Repetition of the process illustrated in FIG. 3 serves to maintain the stable state 64 in which both the frequencies and the phases match.

The process for determining the mean value of changes in the phase difference referred to in step S101 in FIG. 3 will now be explained in detail.

Figure 6:
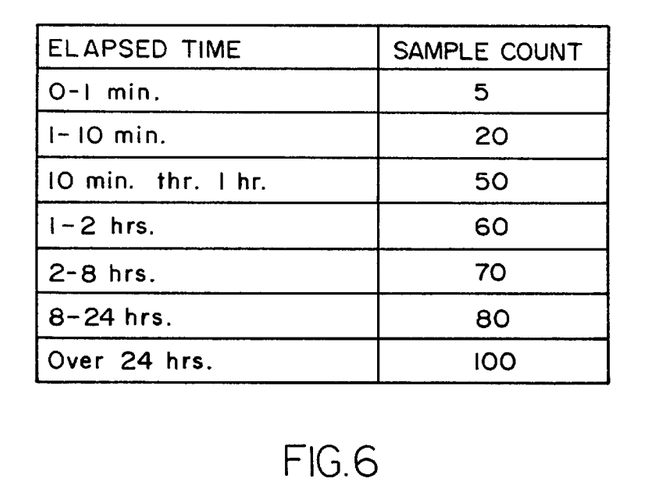
FIG. 6 illustrates an example of tables listing numbers for averaging.

FIG. 6 illustrates an example of averaging sample count-listing tables. The left column 71 in the table describes the elapsed times from power-on. The right column describes the sample counts for averaging which correspond to the respective elapsed times. Since the circuit stability is not high immediately after power-on, the sample count for averaging changes in the phase difference is low. In order to increase one-second precision derived from the reference pulse signal 16, the sample count is increased as the elapsed time increases.

Figure 7:
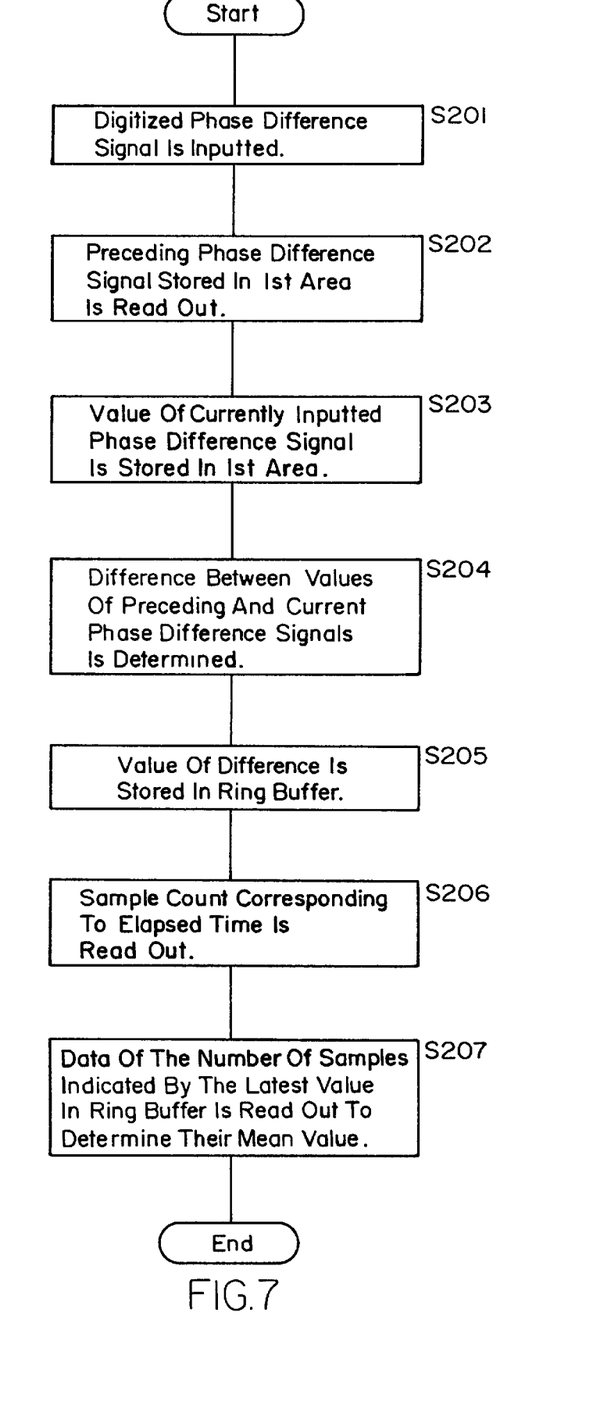
FIG. 7 is a view illustrative of the flow of processing to determine a mean value of changes in phase difference.

FIG. 7 is a view illustrative of the flow of processing to determine the mean value of changes in the phase difference. The CPU 24 is operated to input a digitized phase difference signal from the A/D converter 22 (step S201). The value of the preceding phase difference signal is read out from a first area allocated as an input value-storage area in the internal RAM in advance (step S202). The value of the currently inputted phase difference signal is stored in the first area (step S203). The difference between the value of the preceding phase difference signal read out from the first area is determined (step S204), and the value thereof is written into a ring buffer provided in a given area in the internal RAM (step S205). This ring buffer is sized to store 100 values of the difference, and each time a new difference value is written, the 100th value prior to it is erased.

The CPU 24 inspects the elapsed times from power-on, based on information about time stored in the timer section (not shown), and reads out the sample count matching the time from the averaging sample count-listing table (step S206). The difference values of the number of samples based on the latest reading are read out from the ring buffer to determine their mean value (step S207). Since the mean value is determined based on the values stored in the ring buffer each time a phase difference signal is inputted, the mean value may be determined every second. This means that the value of the frequency control signal 25 may be corrected every second even for increased sample counts for averaging.

Although the reference signal is designed to be generated based on GPD radio waves according to the embodiment explained above, it is the only requisite for the signal to have higher long-term frequency stability than its short-term frequency stability. In addition, although only the sample count for averaging is designed to be varied based on the elapsed times from power-on, the first prescribed value and the second prescribed value, which are the admissible value of the frequency and the admissible value of the phase difference, may be varied as well, corresponding to the elapsed times from power-on. This is because the operation of the voltage-controlled oscillator, the integrator circuit, the A/D converter or the D/A converter is not stable for shorter elapsed times from power-on. Accordingly, in cases where the first prescribed value is set to the minimum immediately after power-on, since it takes much time for the processing in the first stage illustrated in FIG. 3 to be accomplished, a greatly phase-shifted state lasts for a long time. Therefore, the first prescribed value and the second prescribed value are set to values somewhat larger than their minima immediately after power-on. The set values are then approached to the minima gradually as the time elapses. Both the frequency and the phase difference may be matched with those of the reference pulse signal in stages in this way. This results in a shorter time necessary to reach the final stable state.

As describes above, according to the invention as claimed in claim 1, the value of the control voltage at the time when the frequencies match is stored, and the voltage of the control voltage is restored to this value upon completion of phase matching. This allows independent control of the frequency and the phase difference of the voltage-controlled oscillator and thus matching with the frequency and the phase of the reference signal in a relatively short time. In addition, since the oscillation frequency is controlled based on the reference signal, the high frequency stability may be maintained even in cases where the ambient temperature changes. Furthermore, oscillation frequencies and phases of a plurality of oscillators may be matched with higher precision through the use of a common reference signal, without separate compensation for the individual oscillators.

Also, according to the invention as claimed in claim 2, since the oscillation frequency of the voltage-controlled oscillator is controlled based on the mean value of the changes in phase difference over the predetermined cycle count, the long-term frequency stability of the reference signal is incorporated in the stability of the oscillation frequency. For example, the second-interval signal contained in GPS radio waves has excellent long-term frequency stability. This allows control of the oscillation frequency based on the mean value of changes in the phase difference over a long term which leads to provision of a signal with higher frequency stability, without causing the oscillation frequency to moderately change due to change in ambient temperature.

Also, according to the invention as claimed in claim 3, the counting means is used to output a pulse signal with the frequency of an electric signal outputted by the voltage-controlled oscillator which has been changed to match the frequency of the reference signal. This allows control of the oscillation frequency and the phase of the voltage-controlled oscillator with reference to the reference signal even in cases where the oscillation frequency of the voltage-controlled oscillator is different from that of the reference signal. By properly setting the number counted by the counting means and referring to the second-interval reference signal contained in GPS radio waves, for example, an electric signal in phase with the reference signal, with higher frequency stability and with a desired frequency may be outputted from the voltage-controlled oscillator.

Also, according to the invention as claimed in claim 4, since the cycle count for averaging is set so that the frequency stability of the reference signal over the predetermined cycle count is higher than the frequency stability of the voltage control oscillator, the oscillation frequency stability of the voltage-controlled oscillator may be increased on the basis of the mean value of the changes in the phase difference during that term.

Also, according to the invention as claimed in claim 5, since the cycle count for averaging is varied based on the elapsed times from power-on, a degree of frequency stability needed to increase the oscillation frequency stability may be appropriately obtained from the reference signal. For example, the frequency stability of the voltage-controlled oscillator is low immediately after power-on, and is gradually improved with time. Accordingly, the oscillation frequency may efficiently be compensated by changing the cycle count for averaging, depending on the elapsed time from power-on.

What is claimed is:

1. An oscillating apparatus comprising:
    a voltage control oscillator for outputting an electric signal of a frequency based on the voltage of an inputted control signal;
    phase difference change-detecting means for detecting change in the phase difference between the electric signal outputted by the voltage control oscillator and a reference signal of a given frequency;
    first control-voltage varying means for varying the voltage of said control signal to decrease the change in the phase difference detected by the phase difference change-detecting means;
    first comparison means for making a comparison between the admissible change in the phase difference predetermined based on the admissible difference between the frequency of said reference signal and the frequency of the electric signal outputted by said voltage control oscillator, and the change in the phase difference detected by said phase difference change-detecting means;
    control-voltage storage means for storing the voltage of said control signal at the instant when the change in the phase difference has decreased to or below the admissible value;
    phase difference-detecting means for detecting a phase difference between the electric signal outputted by said voltage control oscillator and said reference signal;
    second control-voltage varying means for varying the voltage of said control signal to decrease the phase difference detected by the phase difference-detecting means from the instant when the change in the phase difference has decreased to or below said admissible value;
    second comparison means for making a comparison between the phase difference detected by said phase difference-detecting means, and the predetermined admissible phase difference between said reference signal and the electric signal outputted by said voltage control oscillator; and
    control-voltage supplying means for supplying a control signal at the voltage stored in said control-voltage storage means to said voltage control oscillator from the instant when the detected phase difference has decreased to or below the admissible phase difference.

2. An oscillating apparatus comprising:
    a voltage control oscillator for outputting an electric signal of a frequency based on the voltage of an inputted control signal;
    phase difference change-detecting means for cyclically detecting change in the phase difference between the electric signal outputted by the voltage control oscillator and a given reference signal with more excellent long-term frequency stability than short-term frequency stability; phase difference change-averaging means for determining a mean value of changes in the phase difference over a predetermined cycle count of said reference signal;
    first control-voltage varying means for varying the voltage of said control signal to decrease the mean value of changes in the phase difference determined by the phase difference change-averaging means;
    first comparison means for making a comparison between the admissible change in the phase difference predetermined based on the admissible difference between the frequency of said reference signal and the frequency of the electric signal outputted by said voltage control oscillator, and the mean value determined by said phase difference change-averaging means;
    control-voltage storage means for storing the voltage of said control signal at the instant when the mean value of changes in the phase difference has decreased to or below the admissible value;
    phase difference-detecting means for detecting a phase difference between the electric signal outputted by said voltage control oscillator and said reference signal;

second control-voltage varying means for varying the voltage of said control signal to decrease the phase difference detected by the phase difference-detecting means from the instant when the mean value of changes in the phase difference has decreased to or below said admissible value;

second comparison means for making a comparison between the phase difference detected by said phase difference-detecting means, and the predetermined admissible phase difference between said reference signal and the electric signal outputted by said voltage control oscillator; and control-voltage supplying means for supplying a control signal at the voltage stored in said control-voltage storage means to said voltage control oscillator from the instant when the detected phase difference has decreased to or below the admissible phase difference.

3. An oscillating apparatus comprising:

a voltage control oscillator for outputting an electric signal of a frequency based on the voltage of an inputted control signal;

counting means for outputting a given pulse signal each time the cycle of the electric signal outputted by the voltage control oscillator is counted a number of times equal to the quotient obtained by dividing the frequency of the electric signal outputted by the voltage control oscillator, by the frequency of a given reference signal with more excellent long-term frequency stability than short-term frequencty stability;

phase difference change-detecting means for detecting changes in the phase difference between the pulse signal outputted by the counting means and said given reference signal per cycle of said reference signal;

phase difference change-averaging means for determining a mean value of changes in the phase difference over a predetermined cycle count of said reference signal;

first control-voltage varying means for varying the voltage of said control signal to decrease the mean value of changes in the phase difference determined by the phase difference change-averaging means;

first comparison means for making a comparison between the admissible change in the phase difference predetermined based on the admissible difference between the frequency of said reference signal and the frequency of said pulse signal, and the mean value determined by said phase difference change-averaging means;

control-voltage storage means for storing the voltage of said control signal at the instant when the mean value of changes in the phase difference has decreased to or below the admissible value;

phase difference-detecting means for detecting a phase difference between the pulse signal outputted by said counting means and said reference signal;

second control-voltage varying means for varying the voltage of said control signal to decrease the phase difference detected by the phase difference-detecting means from the instant when the mean value of changes in the phase difference has decreased to or below said admissible value;

second comparison means for making a comparison between the phase difference detected by said phase difference-detecting means, and the predetermined admissible phase difference between said reference signal and the pulse signal; and control-voltage supplying means for supplying a control signal at the voltage stored in said control-voltage storage means to said voltage control oscillator from the instant when the detectfed phase difference has decreased to or below the admissible phase-difference.

4. An oscillator as claimed in claim 2 or 3, wherein the predetermined cycle count for averaging is set so that the frequency stability of said reference signal over the cycle count is higher than the frequency stability of said voltage control oscillator.

5. An oscillator as claimed in claim 2 or 3, wherein said phase difference change-averaging means is equipped with timing means for measuring the elapsed time from power-on, and averaging cycle count-storage means for storing a plurality of cycle counts for averaging which correspond to the elapsed times from power-on, and the cycle count for averaging is varied based on the elapsed times from power-on.

* * * * *

UNITED STATES PATENT AND TRADEMARK OFFICE
CERTIFICATE OF CORRECTION

PATENT NO. : 5,886,583                                 Page 1 of 2
DATED     : March 23, 1999
INVENTOR(S) : Yoshifumi Horiuchi It is certified that error appears in the above-identified patent and that said Letters Patent is hereby corrected as shown below:

On the Title page, item [57] Abstract, line 2:

"arator" should read --comparator--

Column 4, Line 20: "fog" should read --for--

Column 4, Line 35: "f6r" should read --for--

Column 6, Line 20: "acnd" should read --and--

Column 6, Line 45: "lone" should read --long--

Column 8, Line 15: "6: should read --16--

Column 8, Line 28: "valuie" should read --value--

Column 8, Line 53: "to-processing" should read --to processing--

Column 8, Line 54: "f6r" should read --for--

Column 9, Line 32: "lin" should read --in--

UNITED STATES PATENT AND TRADEMARK OFFICE
CERTIFICATE OF CORRECTION

PATENT NO. : 5,886,583
DATED : March 23, 1999
INVENTOR(S) : Yoshifumi Horiuchi

It is certified that error appears in the above-identified patent and that said Letters Patent is hereby corrected as shown below:

Column 14, Line 28: "detectfed" should read --detected--

Signed and Sealed this

Eleventh Day of July, 2000

Attest:

Q. TODD DICKINSON

*Attesting Officer*     *Director of Patents and Trademarks*